(12) United States Patent
Chang et al.

(10) Patent No.: US 10,312,192 B2
(45) Date of Patent: Jun. 4, 2019

(54) INTEGRATED CIRCUIT HAVING STAGGERED CONDUCTIVE FEATURES

(71) Applicant: TAIWAN SEMICONDUCTOR MANUFACTURING CO., LTD., Hsinchu (TW)

(72) Inventors: Fong-Yuan Chang, Hsinchu County (TW); Sheng-Hsiung Chen, Hsinchu (TW); Po-Hsiang Huang, Tainan (TW); Jyun-Hao Chang, Kaohsiung (TW); Chun-Chen Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/171,862

(22) Filed: Jun. 2, 2016

(65) Prior Publication Data

US 2017/0352623 A1  Dec. 7, 2017

(51) Int. Cl.
*H01L 27/02*  (2006.01)
*H01L 23/522*  (2006.01)
*H01L 23/528*  (2006.01)
*H01L 27/118*  (2006.01)
*G06F 17/50*  (2006.01)

(52) U.S. Cl.
CPC ...... *H01L 23/5283* (2013.01); *G06F 17/5068* (2013.01); *G06F 17/5072* (2013.01); *G06F 17/5077* (2013.01); *H01L 23/5226* (2013.01); *H01L 27/0207* (2013.01); *H01L 27/11807* (2013.01); *H01L 2027/11875* (2013.01)

(58) Field of Classification Search
None
See application file for complete search history.

(56) References Cited

U.S. PATENT DOCUMENTS

| | | | |
|---|---|---|---|
| 7,287,320 B2 | 10/2007 | Wang et al. | |
| 9,418,728 B2 | 8/2016 | Liaw | |
| 2003/0111732 A1 | 6/2003 | Goda et al. | |
| 2006/0190918 A1* | 8/2006 | Edwards | G06F 17/5068 716/137 |
| 2008/0304205 A1 | 12/2008 | Bang | |
| 2013/0087834 A1 | 4/2013 | Park et al. | |
| 2013/0334576 A1* | 12/2013 | Park | H01L 27/088 257/204 |

(Continued)

FOREIGN PATENT DOCUMENTS

| | | |
|---|---|---|
| DE | 10 2014 110 957 A1 | 1/2016 |
| KR | 10-2010-0029819 A | 3/2010 |
| KR | 10-2014-0084017 A | 7/2014 |

(Continued)

*Primary Examiner* — Shaun M Campbell
(74) *Attorney, Agent, or Firm* — Maschoff Brennan

(57) ABSTRACT

An integrated circuit includes at least one first conductive feature and at least one second conductive feature. The second conductive feature has at least one extension portion, and the extension portion of the second conductive feature is protruded from the projection of the first conductive feature on the second conductive feature. The integrated circuit further includes at least one third conductive feature, and at least one first conductive via electrically connecting the third conductive feature and the extension portion of the second conductive feature.

20 Claims, 10 Drawing Sheets

(56) References Cited

U.S. PATENT DOCUMENTS

2015/0171005 A1    6/2015  Chen et al.

FOREIGN PATENT DOCUMENTS

| | | |
|---|---|---|
| KR | 10-2015-0068910 A | 6/2015 |
| TW | 200512799 A | 4/2005 |
| TW | 201443679 A | 11/2014 |
| TW | 201531873 A | 8/2015 |
| TW | 201544981 A | 12/2015 |

* cited by examiner

INTEGRATED CIRCUIT HAVING STAGGERED CONDUCTIVE FEATURES

BACKGROUND

Computer-aided cell-based design has been developed for designing large scale ICs such as application specific integrated circuits (ASICs) and gate arrays. The cell is a circuit that has been pre-designed and pre-verified as a building block. In a standard cell design, each distinct cell in a library may have geometries of active, gate, and metal levels. Examples of a standard cell or gate array cell include an inverter, a NAND gate, a NOR gate, a flip flop, and other similar logic circuits.

Integrated circuit design includes two steps: placement and routing. During the placement step, the positions and orientations of cells are determined. During the routing step, interconnects or conductive features are added to connect ports on the cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
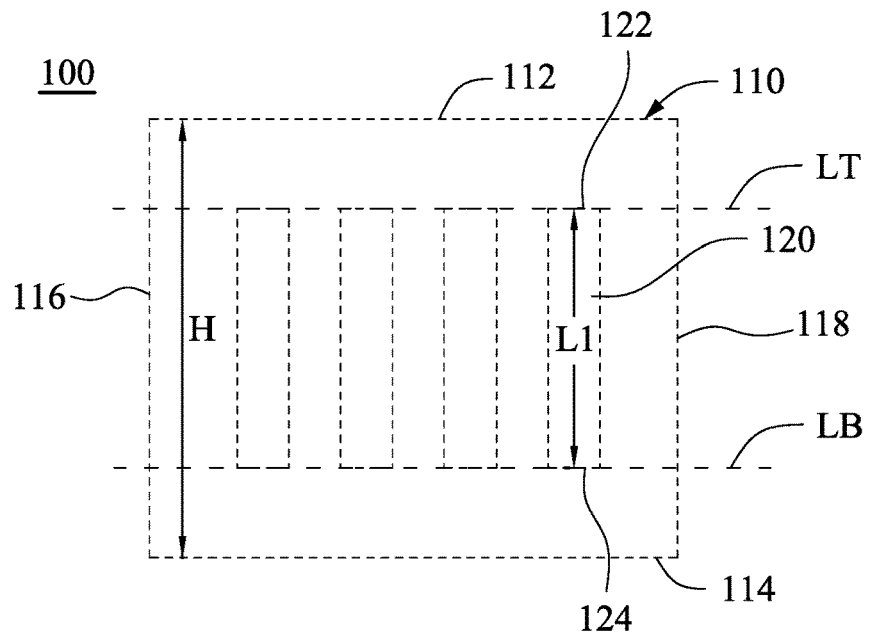
FIG. 1A to FIG. 1C respectively are schematic top views of different stages of a method of designing a cell layout having staggered conductive features in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
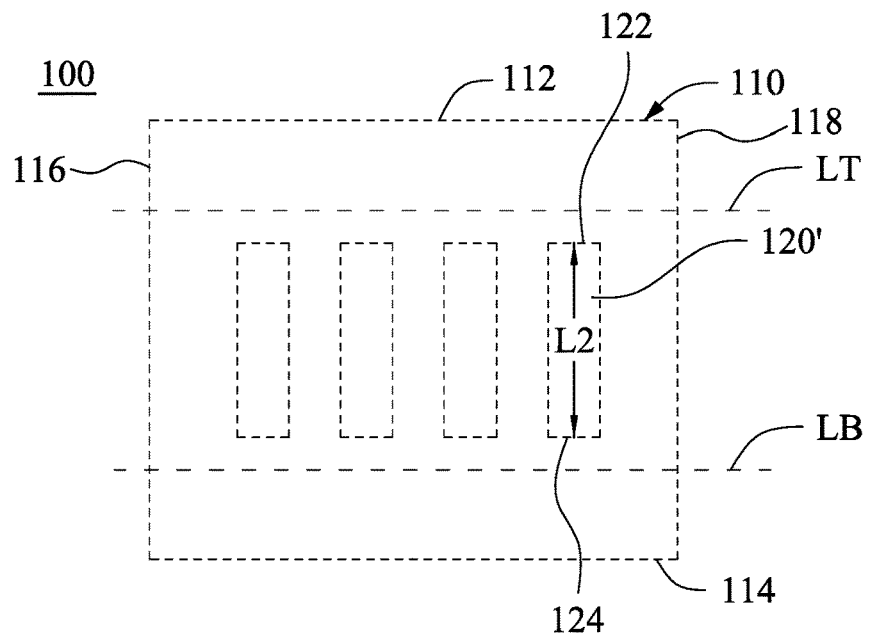
Figure 1C:
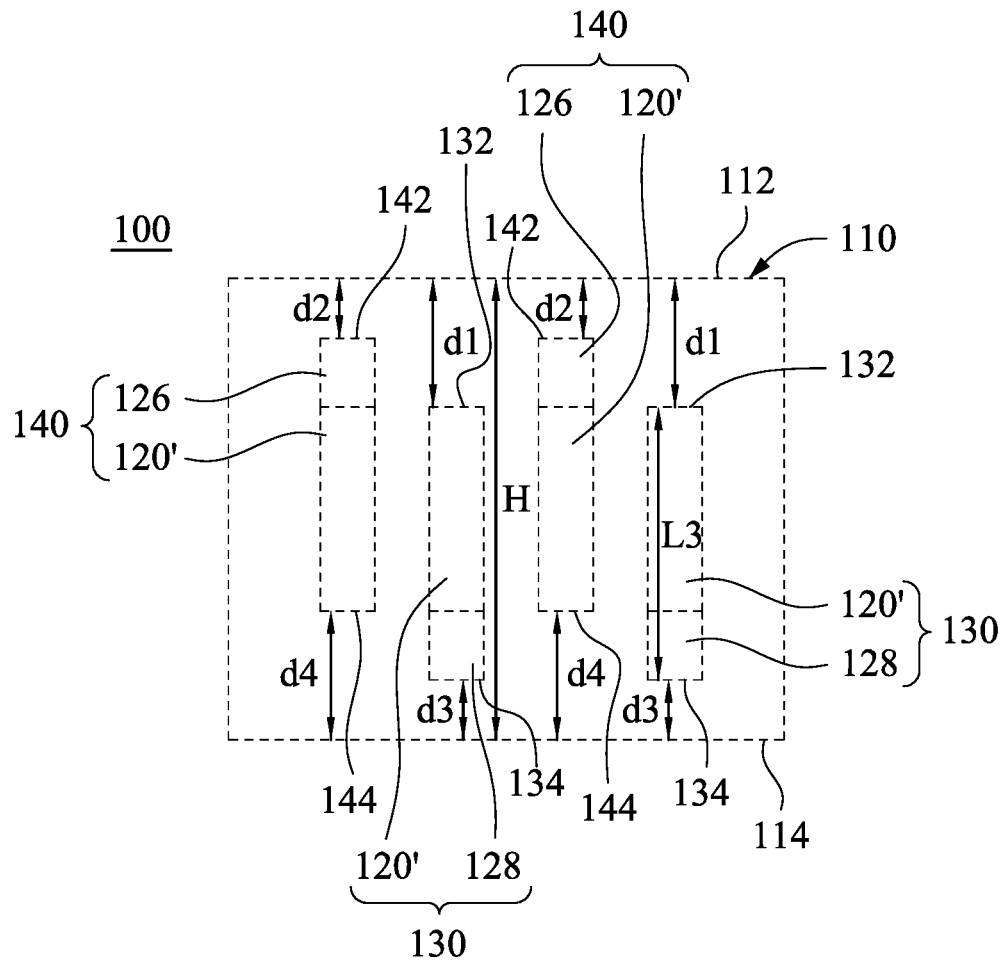

Reference is made to FIG. 1A to FIG. 1C, which respectively are schematic top views of different stages of a method of designing a cell layout having staggered conductive features in accordance with some embodiments of the present disclosure. The designing method begins from FIG. 1A, in which a cell layout 100, such as a layout of a standard cell, is obtained from a cell library. The cell layout 100 has a boundary 110. The boundary 110 is substantially in a shape of rectangular. The boundary 110 includes a top edge 112, a bottom edge 114, and opposite side edges 116 and 118. A cell height H is defined between the top edge 112 and the bottom edge 114. (Note that while the top edge 112 of the boundary 110 is depicted facing upwards in the figures, rotating the cell layout 100 does not change the functions and relative positions of the elements shown. As depicted in the figures, the bottom edge 114 of the boundary 110 is shown oriented facing downwards; however, this does not change which portion is the bottom edge 114, even when the orientation is different.)

The cell layout 100 includes a plurality of standard conductive features 120 defined within the boundary 110. In some embodiments, the standard conductive features 120 are arranged substantially parallel to each other and are arranged substantially equally spaced apart. For example, FIG. 1A illustrates four standard conductive features 120 defined within the boundary 110 of the cell layout 100. In some other embodiments, the number of the standard conductive features 120 may vary according to different design requirements. A distance between adjacent standard conductive features 120 may be determined according to the design rule.

In some embodiments, the standard conductive features 120 have substantially the same length L1. The standard conductive features 120 may be aligned with each other. That is, the standard conductive features 120 are arranged at substantially the same level. As shown in FIG. 1A, top ends 122 of the standard conductive features 120 are aligned with a line LT, and bottom ends 124 of the standard conductive features 120 are aligned with a line LB.

In some embodiments, the standard conductive features 120 are for 5-pitch conductive feature routing, which refers to each of the standard conductive features 120 having five access points. The access point is a position where a conductive feature (e.g., a metal-2 line) can be connected to another conductive feature (e.g., a metal-1 line). The number of the access points plays a role to determine the routing ability, such as routing density and routing flexibility.

Reference is made to FIG. 1B. The standard conductive features 120 of FIG. 1A are shrunk and become shrunk standard conductive features 120'. As shown in FIG. 1B, the shrunk standard conductive features 120' are shortened. Thus, a distance between the top edge 122 and the bottom edge 124 of at least one of the shrunk standard conductive features 120' is smaller than a distance between the line LT and the line LB. The shrunk standard conductive features 120' are present within a space between the line LT and the line LB. Therefore, some extra spaces are created by shrinking the standard conductive features 120 of FIG. 1A. In some embodiments, the shrunk standard conductive features 120' still have substantially the same length L2, in which the length L2 of the shrunk standard conductive features 120 is smaller than the length L1 (as shown in FIG. 1A) of the standard conductive features 120 (as shown in FIG. 1A).

Reference is made to FIG. 1C. Upper extension portions 126 and lower extension portions 128 are respectively added to the shrunk standard conductive features 120'. In some embodiments, each of the shrunk standard conductive features 120' is added with an extension portion, such as the upper extension portions 126 and the lower extension portions 128. As shown in FIG. 1C, the upper extension portions 126 are added to some of the shrunk standard conductive features 120', and the lower extension portions 128 are added to the other shrunk standard conductive features 120'. The shrunk standard conductive features 120' added with the lower extension portions 128 are referred to herein as first conductive features 130. The shrunk standard conductive features 120' added with the upper extension portions 126 are referred to herein as second conductive features 140.

In some embodiments, the first conductive features 130 and second conductive features 140 have substantially the same length L3. The length L3 of the first conductive features 130 and second conductive features 140 can be similar to the length L1 of the standard conductive features 120 (as shown in FIG. 1A) or be longer than or shorter than the length L1 of the standard conductive features 120 (as shown in FIG. 1A). The length L3 of the first conductive features 130 and second conductive features 140 is smaller than the cell height H of the boundary 110.

In some embodiments, the first conductive feature 130 can be present closer to the bottom edge 114 of the boundary 110, and the second conductive feature 140 can be present closer to the top edge 112 of the boundary 110. That is, a first distance d1 from the top ends 132 of the first conductive features 130 to the top edge 112 of the boundary 110 is greater than a second distance d2 from the top ends 142 of the second conductive features 140 to the top edge 112 of the boundary 110. A third distance d3 from the bottom ends 134 of the first conductive features 130 to the bottom edge 114 of the boundary 110 is less than a fourth distance d4 from the bottom ends 144 of the second conductive features 140 to the bottom edge 114 of the boundary 110. In some embodiments, the first conductive feature 130 is protruded from the bottom end 144 of the second conductive feature 140 since the second conductive feature 140 is protruded from the top end 132 of the first conductive features 130. In some embodiments, both the top end 132 and the bottom end 134 of each first conductive feature 130 are located within the boundary 110, and both the top end 142 and the bottom end 144 of each second conductive feature 140 are located within the boundary 110.

Reference is made to both FIG. 1A and FIG. 1C. The first conductive features 130 and the second conductive features 140 are staggered, such that the capacity between the conductive features formed according a layout including the first conductive features 130 and the second conductive features 140 is smaller that between the conductive features formed according to the layout including the standard conductive features 120.

Figure 2:
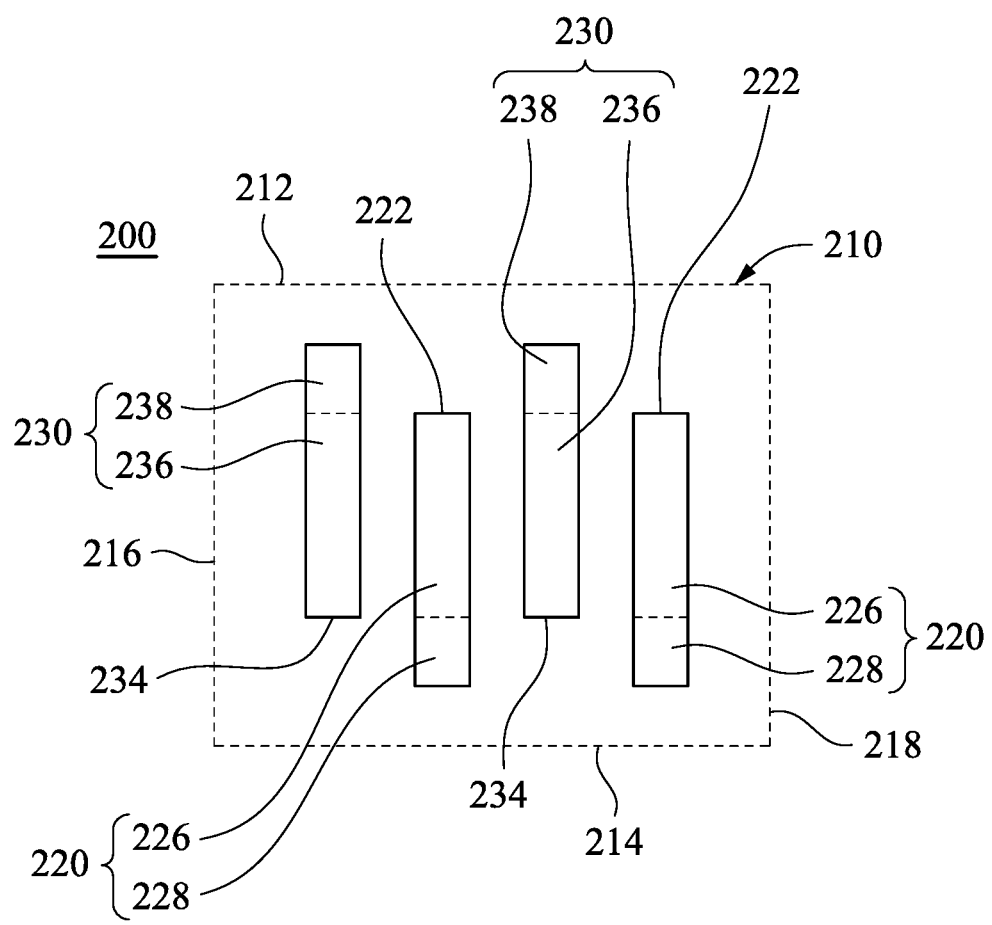
FIG. 2 is a schematic top view of a cell in accordance with some embodiments of the present disclosure.

Referring to FIG. 2, which is a schematic top view of a cell in accordance with some embodiments of the present disclosure. The cell 200 is fabricated according to the cell layout 100 designed as discussed from FIG. 1A to FIG. 1C. The cell 200 includes a boundary 210, at least one first conductive feature 220, and at least one second conductive feature 230. The boundary 210 has a top edge 212, a bottom edge 214, and opposite side edges 216, 218.

The first conductive features 220 and the second conductive features 230 are arranged parallel to each other in the boundary 210, and the first conductive features 220 and the second conductive features 230 are staggered. In some embodiments, the first conductive features 220 and the second conductive features have substantially the same length. The first conductive features 220 and the second conductive features 230 are made of a conductive material. In some embodiments, the first conductive features 220 and the second conductive features 230 are made of metal, such as copper, tungsten, aluminum, or combinations thereof. The first conductive features 220 and the second conductive features 230 are linear-shaped.

In some embodiments, the first conductive features 220 and the second conductive features 230 are alternately arranged. Each of the first conductive features 220 is disposed between two of the second conductive features 230. Each of the second conductive features 230 is disposed between two of the first conductive features 220. The first conductive features 220 and the second conductive features 230 are staggered when viewed from the top. In some other embodiments, the sequence of the first conductive features 220 and the second conductive features 230 is not alternating.

In some embodiments, each of the first conductive features 220 has a first main portion 226 and a first extension portion 228, and each of the second conductive features 230 a second main portion 236 and a second extension portion 238. Ends (e.g. the top ends 222) of the first conductive features 220 have projections on the second conductive features 230, and the second extension portions 238 of the second conductive features 230 protrude from the projections of the ends of the first conductive features 220 on the second conductive features 230. Ends (e.g. the bottom ends 234) distal to the second extension portions 238 of the second conductive features 230 have projections on the first conductive feature 220s, and the first extension portions 228 distal to the ends (e.g. the top ends 222) of the first conductive features 220 protrude from the projections of the ends of the second conductive features 230 on the first conductive features 220.

The number of the access points provided by the cell 200 can be increased by inducing the extension portions 228 and 238. For example, each of the first conductive features 220 may have five access points, and each of the second conductive features 230 may have five access points. Since the first conductive features 220 are arranged closer to the bottom edge 214, and the second conductive features 230 are arranged closer to the top edge 212 in the cell 200, the parts of the first conductive features 220 protruding from the second conductive features 230, such as the first extension portions 228, and the parts of the second conductive features 230 protruding from the first conductive features 220, such as the second extension portions 238. Such arrangement may increase the number of access points.

For example, each first main portion 226 may have four access points, and each first extension portion 228 may have one access point. Each second main portion 236 may have four access points, and each second extension portion 238 may have one access point. Therefore, the cell 200 provides six-pitch access points (e.g. including one access point provided by each first extension portion 228, four access points provided by each first (second) main portion 226 (236), and one access point provided by each second extension portion 238), which is more than the number of the access points of each first conductive feature 220 or each second conductive feature 230 itself.

Figure 3A:
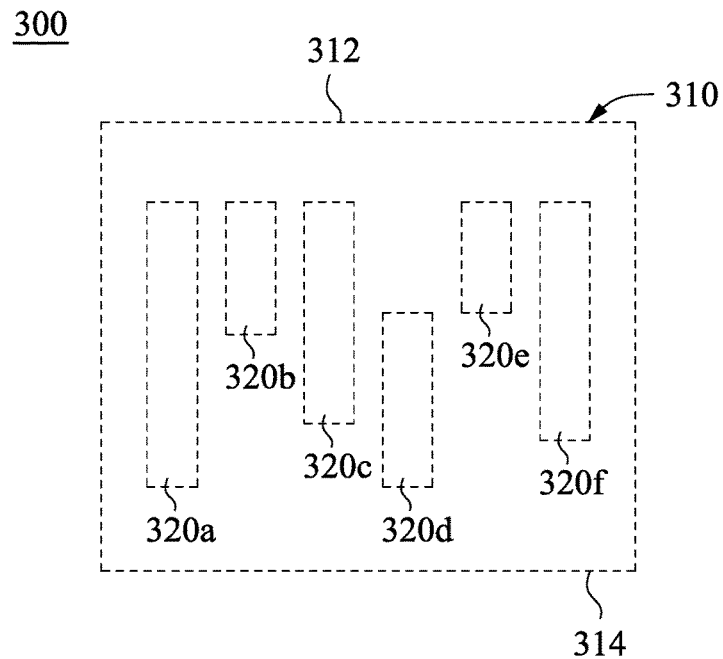
FIG. 3A and FIG. 3B respectively are schematic top views of different stages of a method of designing a cell layout having staggered conductive features in accordance with some embodiments of the present disclosure.
Figure 3B:
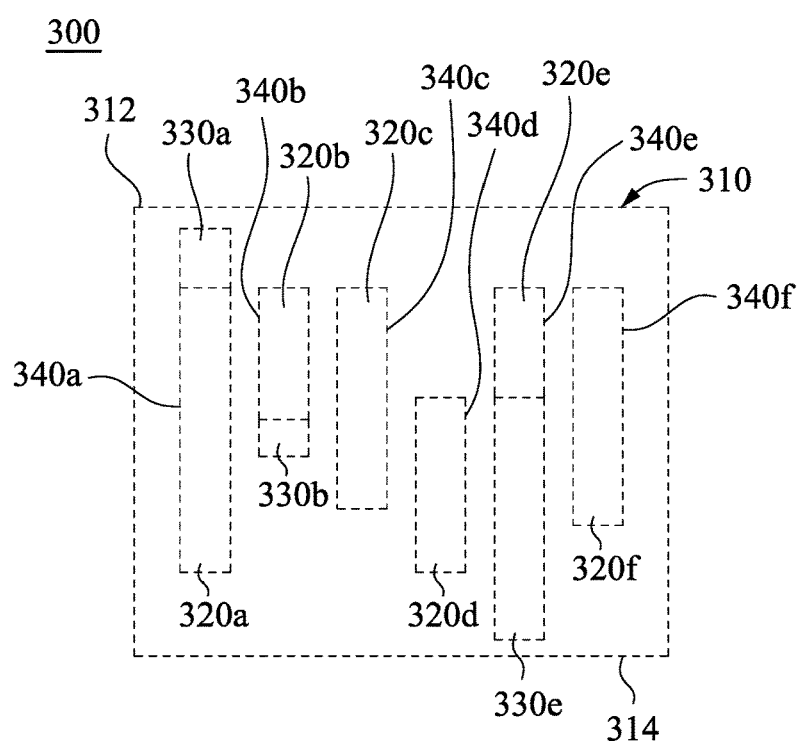

Reference is made to FIG. 3A and FIG. 3B, which respectively are schematic top views of different stages of a method of designing a cell layout having staggered conductive features in accordance with some embodiments of the present disclosure. The method begins at FIG. 3A, in which a cell layout 300, such as a layout of a standard cell, is obtained from a cell library. The cell layout 300 has a boundary 310 and a plurality of standard conductive features 320a-320f present within the boundary 310. In some embodiments, the standard conductive features 320a-320f in the cell layout 300 may have different lengths respectively. For example, the standard conductive features 320a may have a longest length among the standard conductive features 320a-320f, and the standard conductive feature 320e may have a shortest length among the standard conductive features 320a-320f. In some embodiments, at least two of the standard conductive features 320a-320f, e.g. the standard conductive features 320c and 320f may have substantially the same length. In some embodiments, the standard conductive features 320a-320f are not aligned with each other, i.e. the standard conductive features 320a-320f are staggered arranged in the cell layout 300.

Referring to FIG. 3B, at least one extension portion 330 is added to at least one of the standard conductive features 320 according to a desired routing layout. The extension portions 330 are added to some of the standard conductive features 320 to provide additional access points at positions to where metal-2 lines are connected. For example, a top extension portion 330a is added to the standard conductive feature 320a, a bottom extension portion 330b is added to the standard conductive feature 320b, and a bottom extension portion 330e is added to the standard conductive features 320e. The length of each of the extension portions 330 can be the same or different. Since the length, the position, and the number of the extension portions 330 may vary according to the desired routing layout, the design flexibility and routing efficiency can be increased accordingly.

In some embodiment, the conductive features 340a-340f including the standard conductive features 320a-320f and the corresponding extension portions 330a, 330b, and 330e are located within the boundary of the cell layout 300. The conductive features 340a-340f are arranged between the top edge 312 and the bottom edge 314 of the cell layout 300. In some embodiments, the conductive features 340a-340f are arranged parallel and are substantially equally spaced apart from each other. In some embodiments, the length of each of the conductive features 340a-340f can be different, and the conductive features 340a-340f are not aligned with each other. In some embodiments, the conductive features 340a-340f may be arranged in a staggered manner. Therefore, the capacitance present between the adjacent conductive features 340a-340f can be reduced accordingly.

Figure 4A:
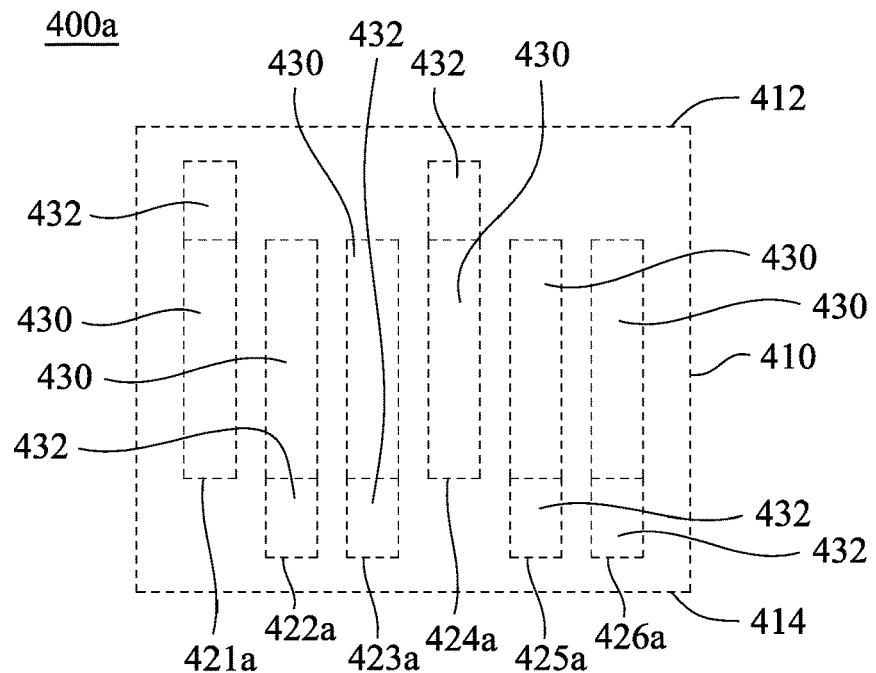
FIG. 4A to FIG. 4C respectively are schematic top views of cell layouts in accordance with different embodiments of the present disclosure.
Figure 4B:
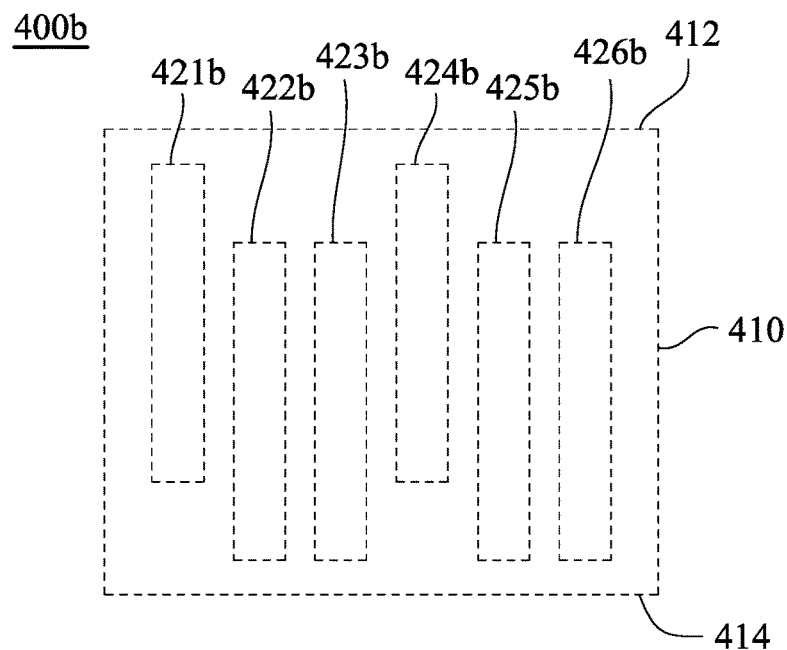
Figure 4C:
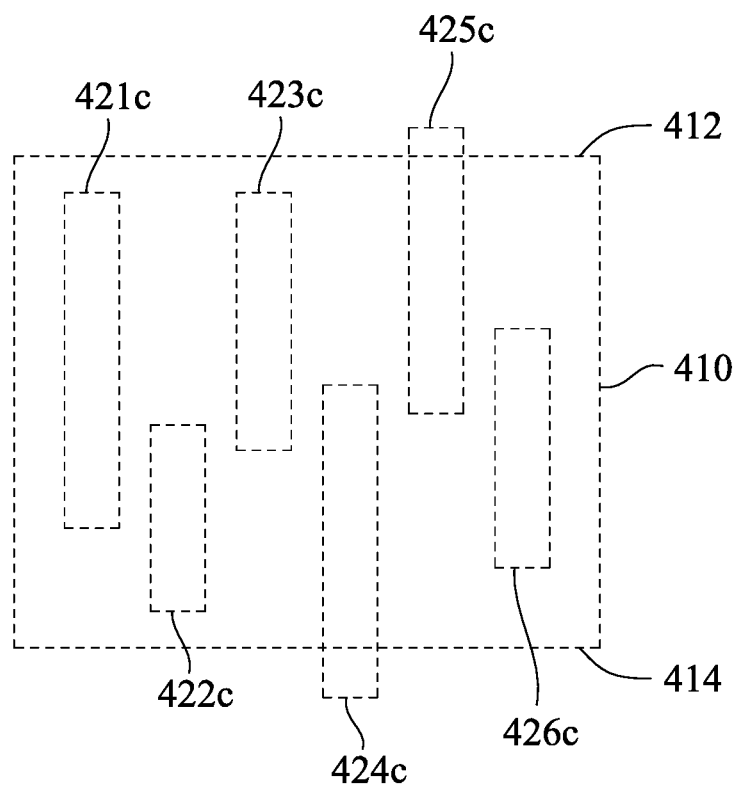

Reference is made to FIG. 4A to FIG. 4C, which respectively are schematic top views of a cell layout in accordance with different embodiments of the present disclosure. For example, the cell layout 400a includes six conductive features 421a-426a sequentially arranged in the boundary 410, as shown in FIG. 4A. In some embodiments, the conductive features 421a-426a have substantially the same length, and the conductive features 421a-426a are in a parallel arrangement. The conductive features 421a-426a may respective include a main portion 430 and a top extension portion 432 or a bottom extension portion 434. In some embodiments, the main portions 430 are arranged at the same level and have substantially the same length. The top extension portion 432 and the bottom extension portion 434 are selectively added to the corresponding main portions 430 according to the desired routing layout. As a result, some of the conductive features 421a-426a are protruded from others. For example, the conductive features 421a and 424a are present closer to the top edge 412 of the boundary 410, and top portions of the conductive features 421a and 424a are protruded from other conductive features (e.g. conductive features 422a, 423a, 425a, and 426a). Namely, the conductive features 422a, 423a, 425a, and 426a are present closer to the bottom edge 414 of the boundary 410, and the bottom portion of the conductive features 422a, 423a, 425a, and 426a are protruded from other (e.g. the conductive features 421a and 424a).

In some other embodiment, such as the cell layout 400b in FIG. 4B, the cell layout 400b includes six conductive features 421b-426b sequentially arranged in the boundary 410. In some embodiments, the cell layout 400b is a standard cell obtained from a cell library, and the staggered conductive features 421b-426b are original conductive features in the cell layout 400b.

In yet other embodiments, the conductive features are randomly arranged in the boundary, as shown in FIG. 4C. The cell layout 400c may have six conductive features 421c-426c sequentially arranged in the boundary 410 in a parallel arrangement. The conductive features 421c-426c may have different lengths, and the conductive features 421c-426c may be arranged at different levels. In some embodiments, at least one of the conductive features 421c-426c extends across the edge of boundary 410. For example, the bottom portion of the conductive feature 424c extends across the bottom edge 414 of the boundary 410, and the top portion of the conductive feature 425c extends across the top edge 412 of the boundary 410. In some embodiments, the cell layout 400c is a standard cell obtained from a cell library, and the staggered conductive features 421c-426c are original conductive features in the cell layout 400c.

It is to be understood that the embodiments discusses from FIG. 4A to FIG. 4C are by examples, such that those skilled in the art can better understand the detailed description that follows. Those skilled in the art can readily use the present disclosure as a basis for designing or modifying other processes and structures. Those skilled in the art should also realize that such equivalent constructions do not depart from the spirit and scope of the present disclosure, and that they can make various changes, substitutions and alterations herein without departing from the spirit and scope of the present disclosure.

Figure 5:
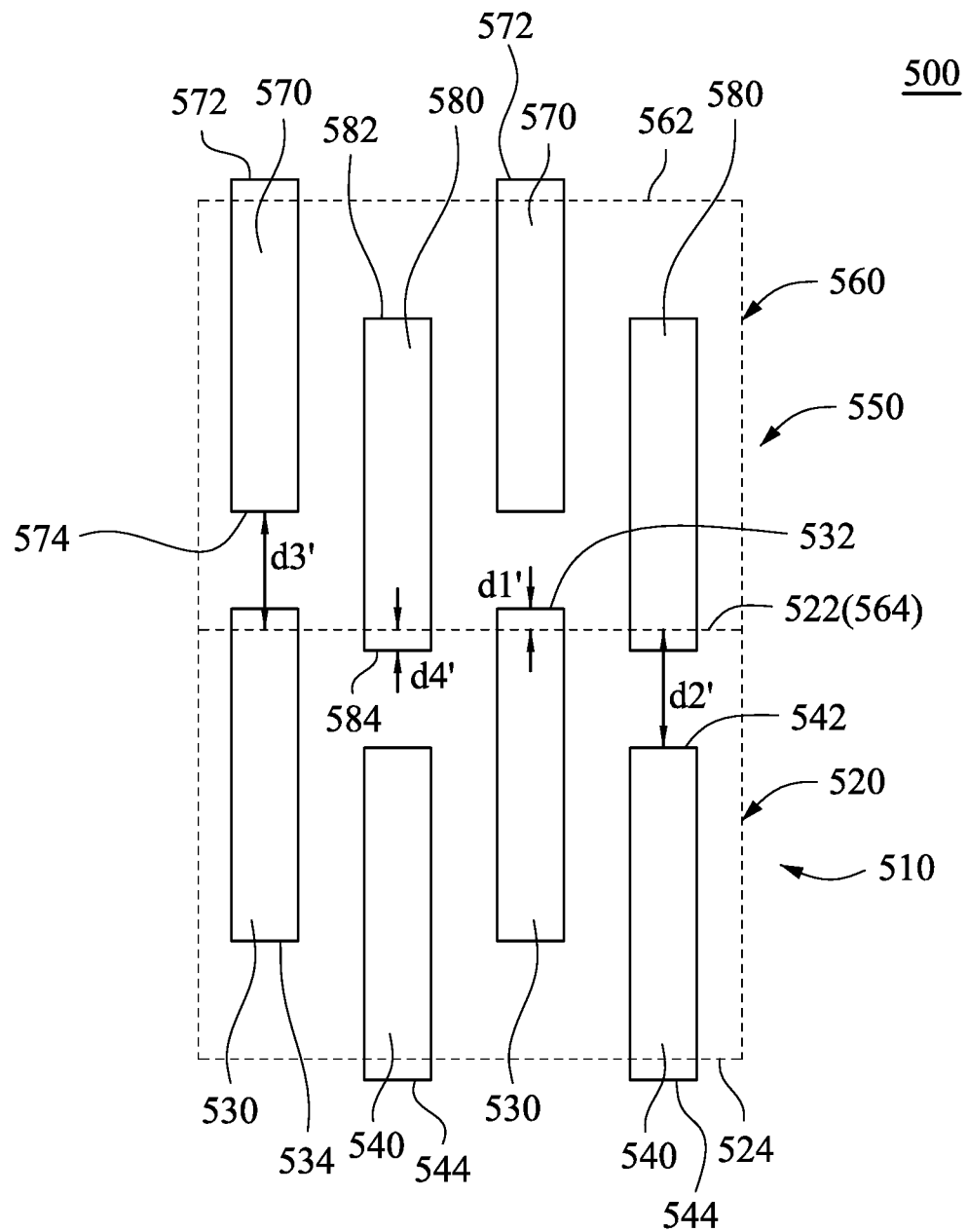
FIG. 5 is a schematic top view of an integrated circuit in accordance with some embodiments of the present disclosure.

Reference is made to FIG. 5, which is a schematic top view of an integrated circuit in accordance with some embodiments of the present disclosure. The integrated circuit 500 includes a plurality of cells. For example, the integrated circuit 500 includes a first cell 510 and a second cell 550. The second cell 550 is abutted vertically on the first cell 510. In some embodiments, the first cell 510 and the second cell 550 have substantially the same layout.

The first cell 510 has a first boundary 520, a plurality of first conductive features 530, and a plurality of second conductive features 540. The first boundary 520 has a first top edge 522 and a first bottom edge 524 for defining a cell height therebetween. The first conductive features 530 and the second conductive features 540 are disposed in the first boundary 520. The first conductive features 530 and the second conductive features 540 have the same length. The first conductive features 530 are arranged closer to the first top edge 522 since the second conductive features 540 are arranged closer to the first bottom edge 524.

The second cell 550 includes a second boundary 560, a plurality of third conductive features 570, and a plurality of fourth conductive features 580. The second boundary 560 has a second top edge 562 and a second bottom edge 564 for defining the cell height there between. The second bottom edge 564 overlaps the first top edge 522. Namely, a common boundary between the first cell 510 and the second cell 550 can be regarded as both the second bottom edge 564 and the first top edge 522. The third conductive features 570 and the fourth conductive features 580 are disposed in the second boundary 560. The third conductive features 570 and the fourth conductive features 580 have the same length. The third conductive features 570 are arranged closer to the second top edge 562 since the fourth conductive features 580 are arranged closer to the second bottom edge 564.

The first conductive features 530, the second conductive features 540, the third conductive features 570, and the fourth conductive features 580 are in a shape of rectangular. The first conductive features 530, the second conductive features 540, the third conductive features 570, and the fourth conductive features 580 are in a parallel arrangement.

In some embodiments, the first conductive features 530 may extend across the first top edge 522, and the second conductive features 540 may extend across the first bottom edge 524. The third conductive features 570 may extend across the second top edge 562, and the fourth conductive features 580 may extend across the second bottom edge 564. The distance d3' from the second bottom edge 564 to the bottom ends 574 of the third conductive features 570 is greater than the distance d1' from the top ends 532 of the first conductive features 530 to the first top edge 522, such that the third conductive features 570 are spaced from the first conductive features 530. The distance d2' from the top ends 542 of the second conductive features 540 to the first top edge 522 is greater than the distance d4' from the second bottom edge 564 to the bottom ends 584 of the fourth conductive features 580, such that the second conductive features 540 are spaced from the fourth conductive features 580.

In some embodiments, the first conductive features 530, the second conductive features 540, the third conductive features 570, and the fourth conductive features 580 can be original conductive features from the standard cell stored in the cell library. In some other embodiments, the first conductive features 530, the second conductive features 540, the third conductive features 570, and the fourth conductive features 580 can include main portions and extension portions, in which the main portion can be standard conductive features from the standard cell or shrunk standard conductive features. The number, the ratio, and the arrangement of the first conductive features 530, the second conductive features 540, the third conductive features 570, and the fourth conductive features 580 may vary according to different design rules and different requirements.

Figure 6:
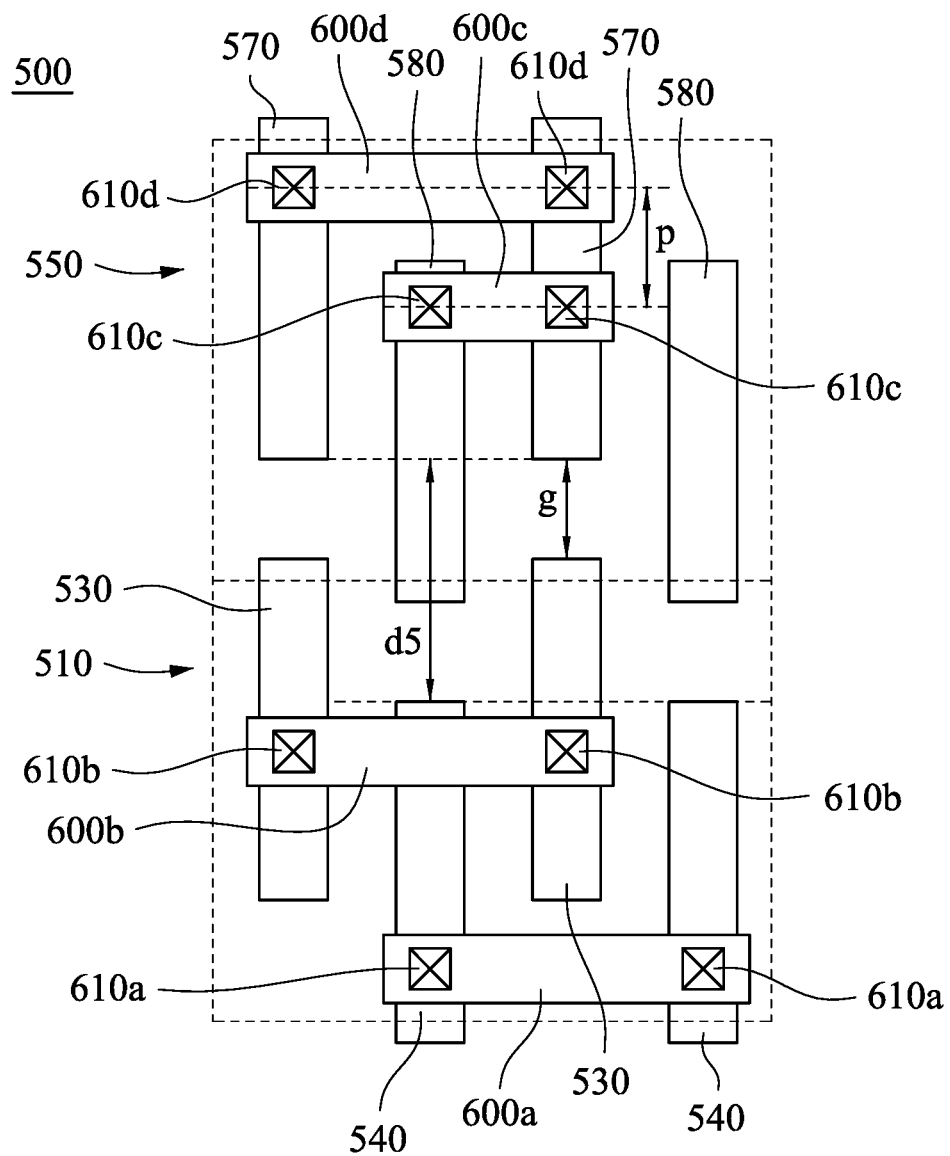
FIG. 6 is a schematic top view of an integrated circuit in accordance with some other embodiments of the present disclosure.

Reference is made to FIG. 6, which is a schematic top view of an integrated circuit in accordance with some other embodiments of the present disclosure. The integrated circuit, such as the integrated circuit 500 as discussed in FIG. 5, further includes a plurality of lateral conductive features 600a-600d and conductive vias 610a-610d for interconnecting the lateral conductive features 600a-600d and the conductive features 530, 540, 570, and 580. The layout of the lateral conductive features 600a-600d and the conductive vias 610a-610d can be design by tools, such as by EDA tools. The first conductive features 530, the second conductive features 540, the third conductive features 570, and the fourth conductive features 580 are present in metal one lines. The lateral conductive features 600a-600d are present in metal two lines.

The lateral conductive feature 600a is utilized to interconnect at least two of the second conductive features 540 at the extension portions of the second conductive features 540 (e.g. the portions of the second conductive features 540 protruding from the first conductive features 530). The extension portions of the second conductive features 540 and the lateral conductive features 600a are cross at the conductive vias 610a, and the conductive vias 610a electrically connected the second conductive features 540 to the lateral conductive feature 600a. In some embodiments, the lateral conductive features 600b interconnects at least any two of the first conductive features 530 and the second conductive features 540, for example, the first conductive features 530 and the lateral conductive features 600b are cross at the conductive vias 610b, and the conductive vias 610b electrically connected the first conductive features 530 to the lateral conductive feature 600b. The lateral conductive feature 600c is utilized to interconnect at least any two of the third conductive features 570 and the fourth conductive features 580, for example, one of the third conductive features 570 and the one of the fourth conductive features 580 are respectively cross the lateral conductive features 600c at the conductive vias 610c, and the conductive vias 610c electrically connected the third conductive feature 570, the fourth conductive feature 580, and the lateral conductive feature 600c. The lateral conductive feature 600d is utilized to interconnect at least two of the third conductive features 570 at the extension portions of the third conductive features 570 (e.g. the portions of the third conductive features 570 protruding from the fourth conductive features 580). The extension portions of the third conductive features 570 and the lateral conductive features 600d are cross at the conductive vias 610d, and the conductive vias 610d electrically connected the third conductive features 570 to the lateral conductive feature 600d.

In some embodiments, the length of the protruding portions of the conductive features 530, 540, 570, 580 are greater than or equal to a pitch P between adjacent two of the lateral conductive features 600a-600d. The pitch P can be regarded as the minimum distance between wires of layers above the pin layer, such as the center line of 610d and the center line of 610c. In some embodiments, the pitch P is not greater than 64 nm. In some embodiments, the distance d5 between the bottom ends of the third conductive features 570 and the top ends of the second conductive features 540 is greater than or equal to a sum of the gap g between the first conductive features 530 and the third conductive features 570 and the pitch P between the conductive feature 600d and conductive feature 600e, e.g., d5≥(g+P).

However, the cell layouts of integrated circuit are only by examples, those skilled in the art can realize that other cell layouts, such as cell layouts discussed in FIG. 3A, FIG. 4A to FIG. 4C, or any other suitable cell layouts having staggered conductive feature arrangement, can be utilized in the integrated circuit for providing extra routing resources and improving routing flexibility.

Figure 7A:
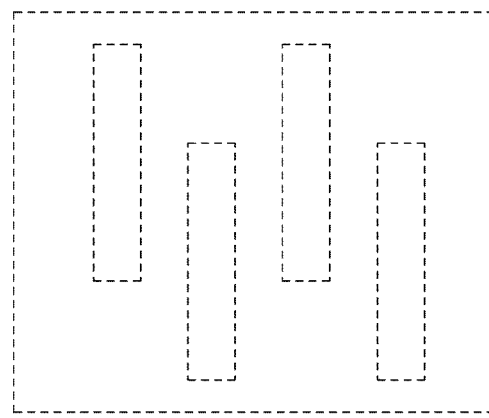
FIG. 7A to FIG. 7C respectively are schematic views of different steps of a method of fabricating a cell in accordance with some embodiments of the present disclosure.
Figure 7B:
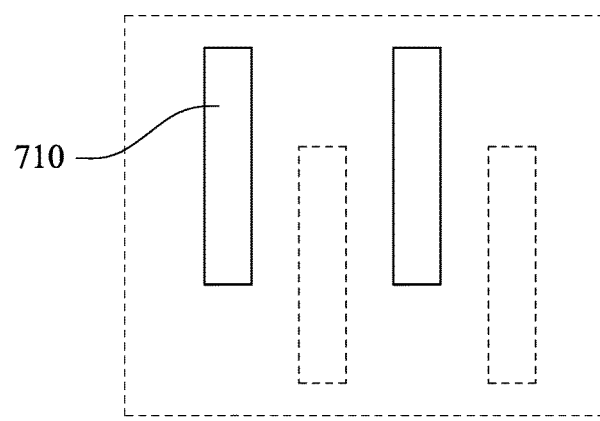
Figure 7C:
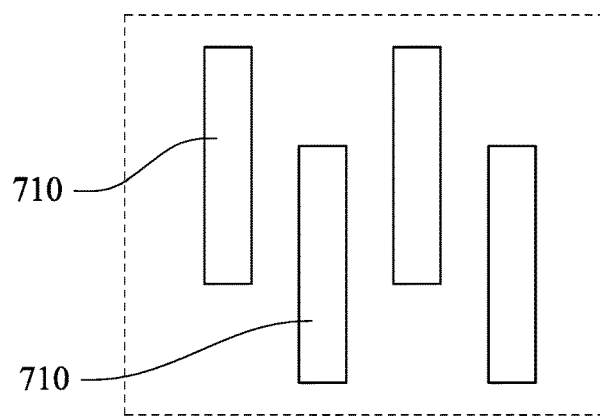

Reference is made to FIG. 7A to FIG. 7C, in which FIG. 7A to FIG. 7C respectively are schematic views of different steps of a method of fabricating a cell in accordance with some embodiments of the present disclosure. Referring to FIG. 7A, a cell layout is provided. For easily understanding, the cell layout 700 is designed as described from FIG. 1A to FIG. 1C, for example. In some embodiments, two masks are utilized for fabricating the conductive features since the distance between the conductive features is tiny. For example, in FIG. 7B, a first mask is utilized for fabricating the odd rows (or the even rows) of the conductive features 710. After the odd rows (or the even rows) of conductive features 710 are formed, a second mask is utilized for fabricating the even rows (or the odd rows) of the conductive features 710, as shown in FIG. 7C.

Figure 8:
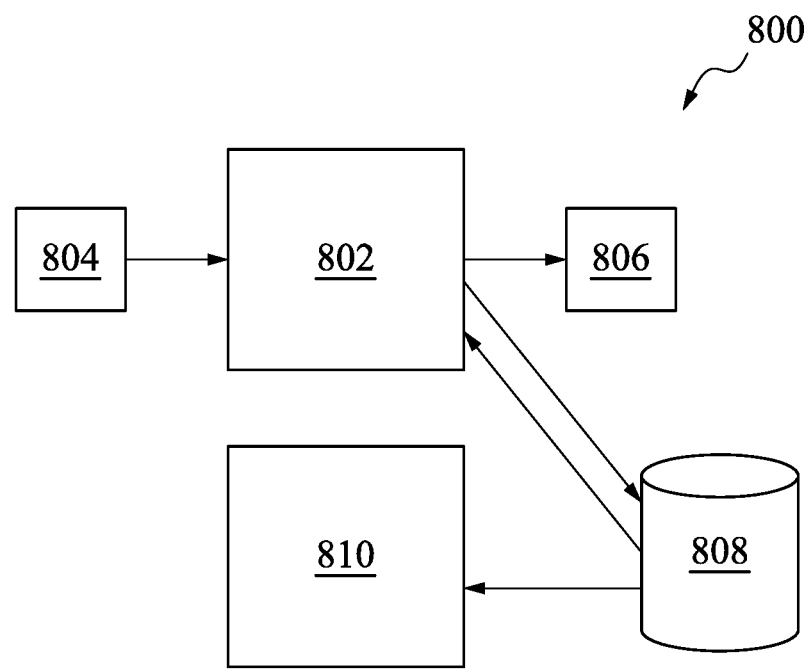
FIG. 8 is a processing system to generate one or more of the above described layout embodiments.

Referring to FIG. 8, which is a processing system to generate one or more of the above described layout embodiments. Processing system 800 includes a processor 802, which may include a central processing unit, an input/output circuitry, a signal processing circuitry, and a volatile and/or a non-volatile memory. Processor 802 receives input, such as user input, from input device 804. The input device 804 may include one or more of a keyboard, a mouse, a tablet, a contact sensitive surface, a stylus, a microphone, and the like. The processor 802 may also receive input, such as standard cells, cell libraries, models, and the like, from a machine readable permanent storage medium 808. The machine readable permanent storage medium may be located locally to the processor 802, or may be remote from the processor 802, in which communications between the processor 802 and the machine readable permanent storage medium 808 occur over a network, such as a telephone network, the Internet, a local area network, wide area network, or the like. The machine readable permanent storage medium 808 may include one or more of a hard disk, magnetic storage, optical storage, non-volatile memory storage, and the like. Included in the machine readable permanent storage medium 808 may be database software for organizing data and instructions stored on the machine readable permanent storage medium 808. The processing system 800 may include an output device 806, such as one or more of a display device, speaker, and the like for outputting information to a user. As described above, the processor 802 generates a layout for an integrated circuit. The layout may be stored in the machine readable permanent storage medium 808. One or more integrated circuit manufacturing machines, such as a photomask generator 810 may communicate with the machine readable permanent storage medium 808, either locally or over a network, either directly or via an intermediate processor such as processor 802. In some embodiments, the photomask generator 810 generates one or more photomasks to be used in the manufacture of an integrated circuit, in conformance with a layout stored in the machine readable permanent storage medium 808.

The conductive features are not arranged at the same level in the cell, in which some of the conductive features have portions protruding from other conductive features, such that the access points of cell can be increased since the extension portions of the conductive features can be regarded as extra access points.

According to some embodiments of the present disclosure, an integrated circuit includes at least one first conductive feature having at least one end, and at least one second conductive feature having at least one extension portion. The end of the first conductive feature has a projection on the second conductive feature, and the extension portion of the second conductive feature protrudes from the projection of the end of the first conductive feature on the second conductive feature. The integrated circuit further includes at least one third conductive feature, and at least one first conductive via electrically connects the third conductive feature and the extension portion of the second conductive feature.

According to some embodiments, an integrated circuit includes a plurality of first conductive features and a plurality of second conductive features. Each of the first conductive features has a first end, and the first ends of the first conductive features are aligned with each other. Each of the second conductive features has a first end, and the first ends of the second conductive features are aligned with each other. The first conductive features and the second conductive features are arranged to form a staggered configuration.

According to some embodiments, a method of configuring an integrated circuit layout using a processor includes using the processor generating a plurality conductive features; using the processor extending a length of at least one of the conductive features to form a staggered configuration; generating a set of instructions for manufacturing an integrated circuit based upon the integrated circuit layout; and storing the set of instructions in an non-transitory machine readable storage medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
 a first cell and a second cell abutting the first cell, the first and second cells being configured to perform a logic function, wherein each of the first and second cells comprises:
 a plurality of first conductive features, each of which has an end;
 a plurality of second conductive features, each of which has an extension portion, said ends of the first conductive features having a projection on the second conductive features, the extension portions of the second conductive features protruding from the projection of said ends of the first conductive features on the second conductive features, wherein the first conductive features and the second conductive features have the same length and are alternately arranged, one of the first conductive features and one of the second conductive features are arranged along first adjacent columns, and another of the first conductive features and another of the second conductive features are arranged along second adjacent columns adjacent the first adjacent columns, wherein the extension portion of at least one of the second conductive features of the first cell is interposed directly between two of the first conductive features of the second cell;
 a third conductive feature; and at least one first conductive via electrically connecting the third conductive feature and at least one of the extension portions of the second conductive features.

2. The integrated circuit of claim 1, wherein the third conductive feature and the at least one of the extension portions of the second conductive features cross at the first conductive via.

3. The integrated circuit of claim 1, wherein each of the second conductive features has an end distal to the corresponding extension portion of the second conductive feature, each of the first conductive features has an extension portion distal to said end of the first conductive feature, said end of each of the second conductive features has a projection on the corresponding first conductive feature, and the extension portion of each of the first conductive features protrudes from the projection of said end of the corresponding second conductive feature on the first conductive feature.

4. The integrated circuit of claim 3, further comprising:
a fourth conductive feature; and
a second conductive via electrically connecting the fourth conductive feature and one of said extension portions of the first conductive features.

5. The integrated circuit of claim 4, wherein the fourth conductive feature and the one of the extension portions of the first conductive features cross at the second conductive via.

6. The integrated circuit of claim 1, wherein the first conductive features, the second conductive features, and the third conductive feature are linear-shaped.

7. The integrated circuit of claim 1, wherein the first conductive features are parallel to the second conductive features.

8. The integrated circuit of claim 1, wherein the first conductive features are made of metal.

9. The integrated circuit of claim 8, wherein the second conductive features are made of metal.

10. An integrated circuit comprising:
a first cell and a second cell abutting the first cell, the first and second cell being configured to perform a logic function wherein each of the first and second cells comprises:
a plurality of first conductive features, the first conductive features each having a first end, the first ends of the first conductive features being aligned with each other; and
a plurality of second conductive features, the second conductive features each having a first end, the first ends of the second conductive features being aligned with each other, wherein the first conductive features and the second conductive features have the same length and are alternately arranged, one of the first conductive features and one of the second conductive features are arranged along first adjacent columns, and another of the first conductive features and another of the second conductive features are arranged along second adjacent columns adjacent the first adjacent columns, wherein at least one of the second conductive features of the first cell is interposed directly between two of the first conductive features of the second cell.

11. The integrated circuit of claim 10, wherein the first conductive features each has a second end distal to the first end of the corresponding first conductive feature, and the second ends of the first conductive features are aligned with each other.

12. The integrated circuit of claim 11, wherein the second conductive features each has a second end distal to the first end of the corresponding second conductive feature, and the second ends of the second conductive features are aligned with each other.

13. The integrated circuit of claim 10, wherein the first conductive features are made of metal.

14. The integrated circuit of claim 10, wherein the second conductive features are made of metal.

15. The integrated circuit of claim 1, wherein the third conductive feature is perpendicular to the second conductive features.

16. The integrated circuit of claim 1, wherein the third conductive feature interconnects adjacent two of the second conductive features.

17. The integrated circuit of claim 5, wherein the fourth conductive feature interconnects adjacent two of the first conductive features.

18. An integrated circuit comprising:
a first cell and a second cell abutting the first cell, the first and second cells being configured to perform a logic function, wherein each of the first and second cell comprises:
a plurality of first conductive features having the same length and arranged along first adjacent columns, wherein ends of an adjacent pair of the first conductive features are misaligned with each other; and
a plurality of second conductive features having the same length as the first conductive features and arranged along second adjacent columns adjacent the first adjacent columns, wherein an end of each of the second conductive features is aligned with an end of a respective one of the first conductive features, wherein one of the first conductive features of the first cell is interposed directly between one of the first conductive features of the second cell and one of the second conductive features of the second cell.

19. The integrated circuit of claim 18, wherein the first conductive features and the second conductive features are linear-shaped.

20. The integrated circuit of claim 18, further comprising a third conductive feature disposed crossing at least one of the first conductive features and at least one of the second conductive features.

* * * * *